United States Patent
Tsai et al.

(10) Patent No.: US 9,123,776 B2
(45) Date of Patent: Sep. 1, 2015

(54) SELF-ALIGNED DOUBLE SPACER PATTERNING PROCESS

(71) Applicant: Taiwan Semiconductor Manufacturing Company, Ltd., Hsin-Chu (TW)

(72) Inventors: Cheng-Hsiung Tsai, Zhunan Township (TW); Yung-Hsu Wu, Taipei (TW); Tsung-Min Huang, Taichung (TW); Chung-Ju Lee, Hsin-Chu (TW); Tien-I Bao, Dayuan Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/096,963

(22) Filed: Dec. 4, 2013

(65) Prior Publication Data

US 2015/0155198 A1  Jun. 4, 2015

(51) Int. Cl.
*H01L 21/768* (2006.01)
*H01L 21/311* (2006.01)
*H01L 21/3213* (2006.01)
*H01L 21/033* (2006.01)

(52) U.S. Cl.
CPC ...... *H01L 21/76802* (2013.01); *H01L 21/0332* (2013.01); *H01L 21/0337* (2013.01); *H01L 21/32133* (2013.01); *H01L 21/32139* (2013.01); *H01L 21/76877* (2013.01)

(58) Field of Classification Search
USPC .................................................. 438/702–703
See application file for complete search history.

(56) References Cited

U.S. PATENT DOCUMENTS

| | | | |
|---|---|---|---|
| 2013/0299846 A1* | 11/2013 | Donkers et al. | 257/76 |
| 2014/0057436 A1* | 2/2014 | Chen et al. | 438/675 |
| 2014/0329388 A1* | 11/2014 | Jang et al. | 438/702 |

* cited by examiner

*Primary Examiner* — Mamadou Diallo
(74) *Attorney, Agent, or Firm* — Slater & Matsil, L.L.P.

(57) ABSTRACT

Embodiments of the present disclosure are a method of forming a semiconductor device and methods of patterning a semiconductor device. An embodiment is a method of forming a semiconductor device, the method including forming a first hard mask layer over a semiconductor device layer, forming a set of mandrels over the first hard mask layer, and forming a first spacer layer over the set of mandrels and the first hard mask layer. The method further includes forming a second spacer layer over the first spacer layer, patterning the first spacer layer and the second spacer layer to form a mask pattern, and patterning the first hard mask layer using the mask pattern as a mask.

20 Claims, 13 Drawing Sheets

SELF-ALIGNED DOUBLE SPACER PATTERNING PROCESS

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
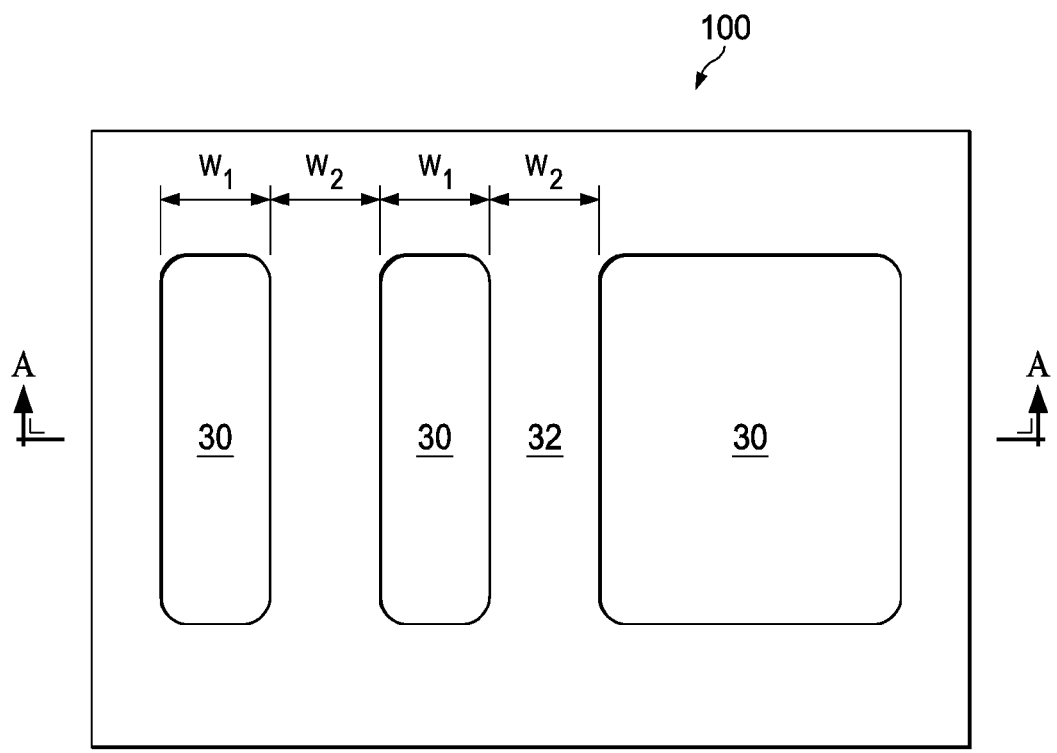
FIGS. 1A, 1B, 2A, 2B, 3A, 3B, 4A, 4B, 5A, 5B, 6A, 6B, 7A, 7B, 8A, 8B, 9A, 9B, 10A, 10B, 11, and 12 are top-views and cross-sectional views of intermediate stages in the patterning of a semiconductor device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a method for patterning a semiconductor device layer by transferring multiple patterns to a hard mask layer over the semiconductor device layer. At least one of the patterns includes a first spacer conformally deposited over mandrels and a second spacer layer deposited over the first spacer layer.

Figure 1B:
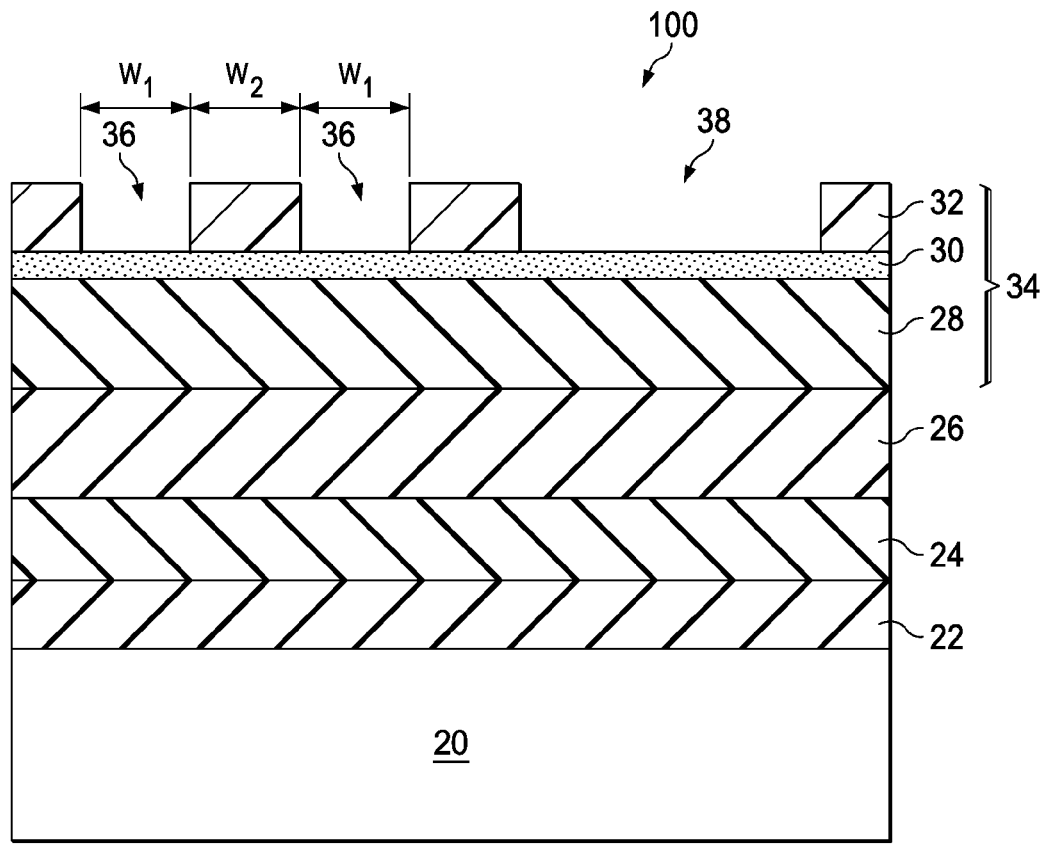

FIGS. 1A through 12 are top views and cross-sectional views of intermediate stages in the patterning of a semiconductor device 100 in accordance with an embodiment. FIGS. 1A and 1B illustrate a top view and a cross-sectional view, respectively, of a semiconductor device 100 at an intermediate stage of processing. FIG. 1B is a cross-sectional view along the line A-A in FIG. 1A. FIGS. 2B through 10B are also cross-sectional views along the same line A-A in each of the respective top view (FIGS. 2A through 10A), although the line A-A is not shown on these subsequent Figures.

Referring to FIGS. 1A and 1B, the semiconductor device 100 includes a semiconductor device layer 20, an anti-reflective coating (ARC) 22, hard mask layers 24 and 26, and a tri-layer photoresist 34 over the hard mask layers 24 and 26. The semiconductor device layer 20 is a layer that requires patterning. In some embodiments, the semiconductor device layer 20 is a metallic layer to be used for metal lines and is made of copper, aluminum, the like, or a combination thereof. In other embodiments, the semiconductor device layer 20 is a dielectric layer, such as a low-k dielectric layer, a polymer layer, or the like. In yet other embodiments, the semiconductor device layer 20 is a substrate and is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In the embodiments wherein the semiconductor device layer 20 is not a substrate, a substrate (not shown) may be below the semiconductor device layer 20. The substrate (not shown) may be formed of similar materials as described above, and the description will not be repeated herein.

The substrate (not shown) or in the embodiment wherein the semiconductor device layer 20 is a substrate may include active and passive devices (not shown). As one of ordinary skill in the art will recognize, a wide variety of devices such as transistors, capacitors, resistors, combinations of these, and the like may be used to generate the structural and functional requirements of the design for the semiconductor device 100. The active and passive devices may be formed using any suitable methods.

The ARC 22 may be formed over the semiconductor device layer 20. The ARC 22 prevents radiation in subsequent photolithographic processes from reflecting off layers below and interfering with the exposure process. Such interference can increase the critical dimension of the photolithography process. Sometimes the ARC 22 is referred to as an anti-reflective layer (ARL) 22. In some embodiments, the ARC 22 is a nitrogen-free ARC (NFARC) 22 and is made of a silicon-rich oxide (SRO), silicon oxycarbide, the like, or a combination thereof. In some embodiments, the ARC 22 is formed by chemical vapor deposition (CVD), plasma enhanced CVD (PECVD), the like, or a combination thereof.

The hard mask layers 24 and 26 are formed over the ARC 22. In an embodiment, the hard mask layer 24 is a metal hard mask layer and the hard mask layer 26 is a dielectric hard mask layer. In subsequent processing steps, a pattern is transferred onto the hard mask layer 24 using various photolithography and etching techniques. The hard mask layer 24 may then be used as a patterning mask for etching the underlying ARC 22 and the semiconductor device layer 20 (see FIG. 11). The hard mask layer 24 may be a masking material such as titanium nitride, tetraethyl orthosilicate (TEOS), silicon nitride, the like, or a combination thereof. The hard mask layer 24 may be formed using a process such as CVD, physical vapor deposition (PVD), atomic layer deposition (ALD), the like, or a combination thereof. In an embodiment, the hard mask layer 24 is formed to have a thickness from about 300 Angstroms to about 1000 Angstroms.

The hard mask layer 26 is formed over the hard mask layer 24. The hard mask layer 26 may be used to form mandrels 26' (see FIG. 3B) and will be referred to as a mandrel layer 26 hereinafter. The mandrel layer 26 may be a masking material such as silicon nitride, an oxide, silicon, amorphous silicon, the like, or a combination thereof or any other material that may be patterned and selectively removed. The mandrel layer 26 may be formed using a process such as CVD, ALD, the like, or a combination thereof. In an embodiment, the mandrel layer 26 is formed to have a thickness from about 500 Angstroms to about 1200 Angstroms.

The tri-layer photoresist 34 is formed over the mandrel layer 26. The tri-layer photoresist 34 includes a top photoresist layer 32, a middle layer 30, and a bottom layer 28. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 26). The tri-layer photoresist provides a relatively thin top photoresist layer 32. The middle layer 30 may include anti-reflective materials (e.g., a backside anti-reflective coating (BARC) layer) to aid the exposure and focus of the top photoresist layer 32's processing. By having the middle layer 30, the thin top photoresist layer 32 is only used to pattern the middle layer 30. The bottom layer 28 may include a hard mask material such as a carbon-containing material that is easily removed by $O_2$ or a $N_2/H_2$ plasma. The middle layer 30 is used to pattern the bottom layer 28. In some embodiments, the middle layer 30 has a high etch selectivity to the bottom layer 28, and, in some embodiments, the bottom layer 28 is more than ten times thicker than the middle layer 30. Thus, the tri-layer photoresist 34 allows for the robust patterning of underlying layers (e.g., the mandrel layer 26) while still providing a relatively thin top photoresist layer 32.

The top photoresist layer 32 may be patterned using any suitable photolithography technique. For example, a photomask (not shown) may be disposed over the top photoresist layer 32, which may then be exposed to a radiation beam including an ultraviolet (UV) or an excimer laser such as a 248 nm beam from a Krypton Fluoride (KrF) excimer laser, or a 193 nm beam from an Argon Fluoride (ArF) excimer laser. Exposure of the top photoresist layer 32 may be performed using an immersion lithography system to increase resolution and decrease the minimum achievable pitch. A bake or cure operation may be performed to harden the top photoresist layer 32, and a developer may be used to remove either the exposed or unexposed portions of the top photoresist layer 32 depending on whether a positive or negative resist is used. Thus, a pattern such as the pattern illustrated in FIGS. 1A and 1B is formed in the top photoresist layer 32 including the two openings 36 in the top photoresist layer 32 each having a width $W_1$ and another opening 38 capable of having various widths depending on the design of the semiconductor device 100. The two openings 36 are separated by a width $W_2$. The widths $W_1$, $W_2$, and subsequent widths are described in terms of the desired spacing and/or width of a pattern to be applied to the semiconductor device layer 20 (see FIGS. 10A and 10B) which will represented by X. In an embodiment, the width $W_1$ is about 3X and the width $W_2$ is about 3X. In an exemplary embodiment, the desired spacing and width value of X is 16 nm. In this example, the pitch of the resulting pattern would be 32 nm (see FIGS. 10A and 10B), the width $W_1$ (3X) would be about 48 nm, and the width $W_2$ (3X) would be about 48 nm.

Figure 11:
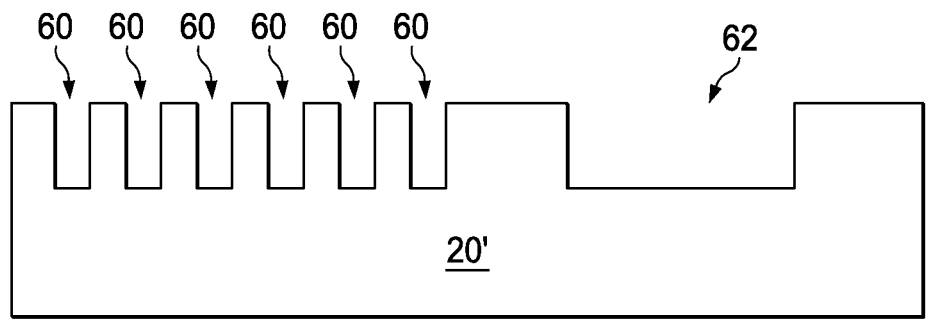

FIGS. 1A and 1B illustrate two openings 36 and another opening 38 in the top photoresist layer 32, although there may be more or less openings depending on the number of mandrels 26' and trenches 60 and 62 that are desired (see FIG. 11). In addition, although the width and spacing of the trenches 60 in FIG. 11 are equal, this disclosure contemplates other embodiments wherein the width and spacing of the trenches 60 are not equal.

Figure 2A:
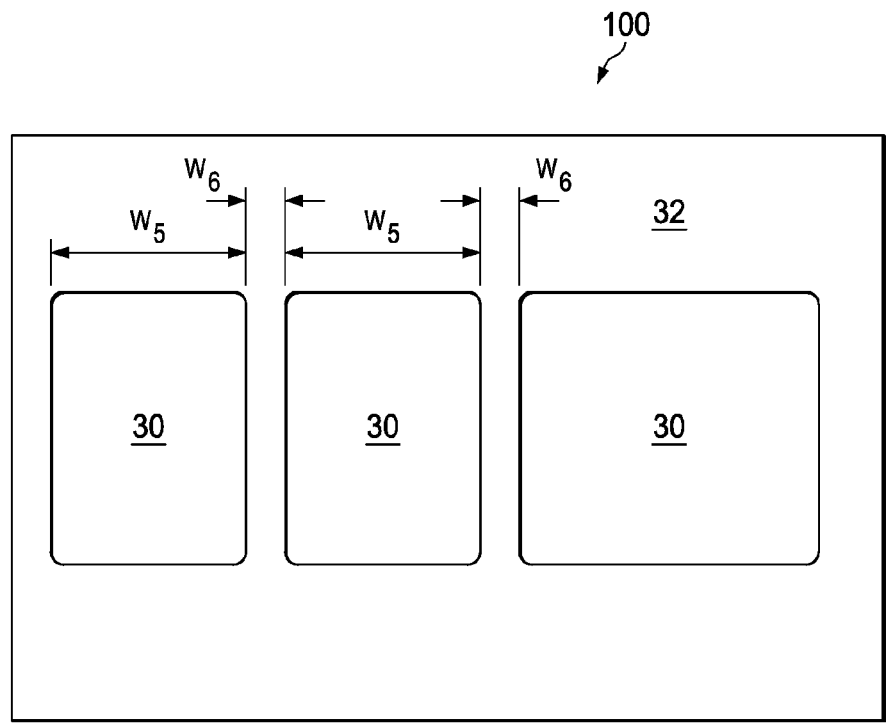
Figure 2B:
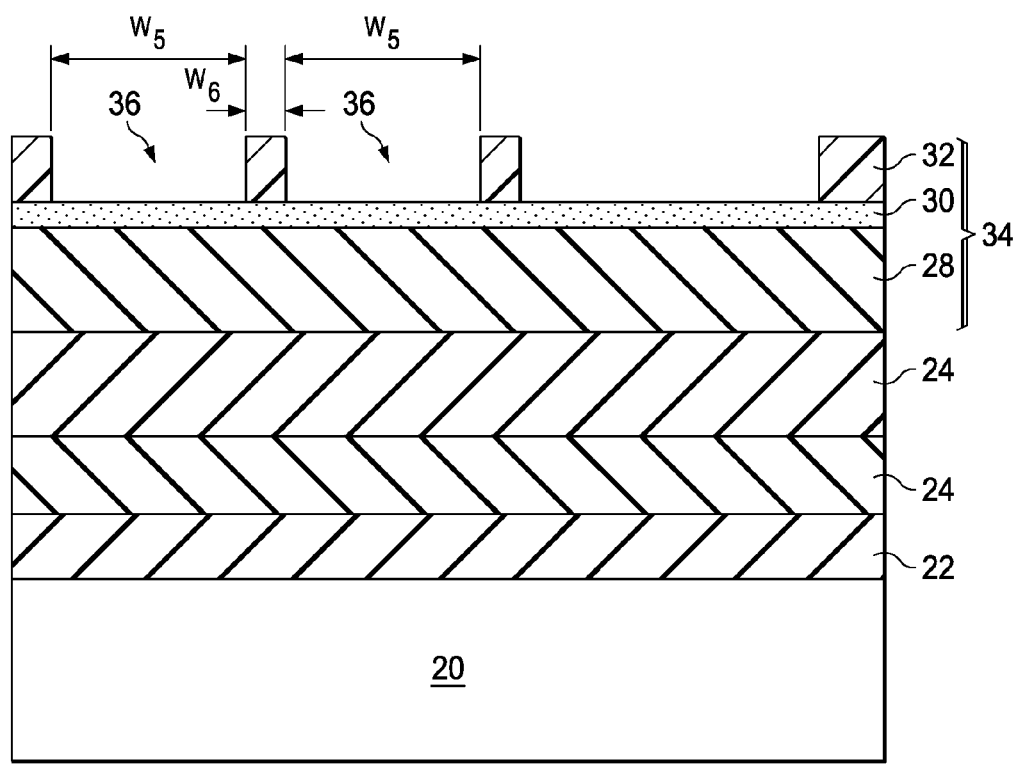

FIGS. 2A and 2B illustrate the resulting structure after the top photoresist layer 32 has been trimmed. In an embodiment, the trimming process is an anisotropic plasma etch process with process gases including $O_2$, $CO_2$, $N_2/H_2$, $H_2$, the like, a combination thereof, or any other gases suitable for trimming photoresist. In an embodiment, the photoresist trimming process is performed at a temperature from about 20° C. to about 80° C., at a pressure from about 20 milliTorr to about 150 milliTorr, for a duration of about 30 seconds to about 2 minutes. The variables in the photoresist trimming process may be varied based on the desired final photoresist profile. After the photoresist trim process, the two openings 36 of the top photoresist layer 32 each have widths $W_5$. The two openings 36 are separated by a width $W_6$. In some embodiment, the width $W_5$ is larger than the width $W_1$ and the width $W_6$ is smaller than the width $W_2$. In an embodiment, width $W_5$ is about 5X and the width $W_6$ is about 1X. In the embodiment where X is about 16 nm, $W_5$ is about 80 nm and $W_6$ is about 16 nm. In some embodiments, the opening 38 also has larger width than before the photoresist trimming process.

Figure 3A:
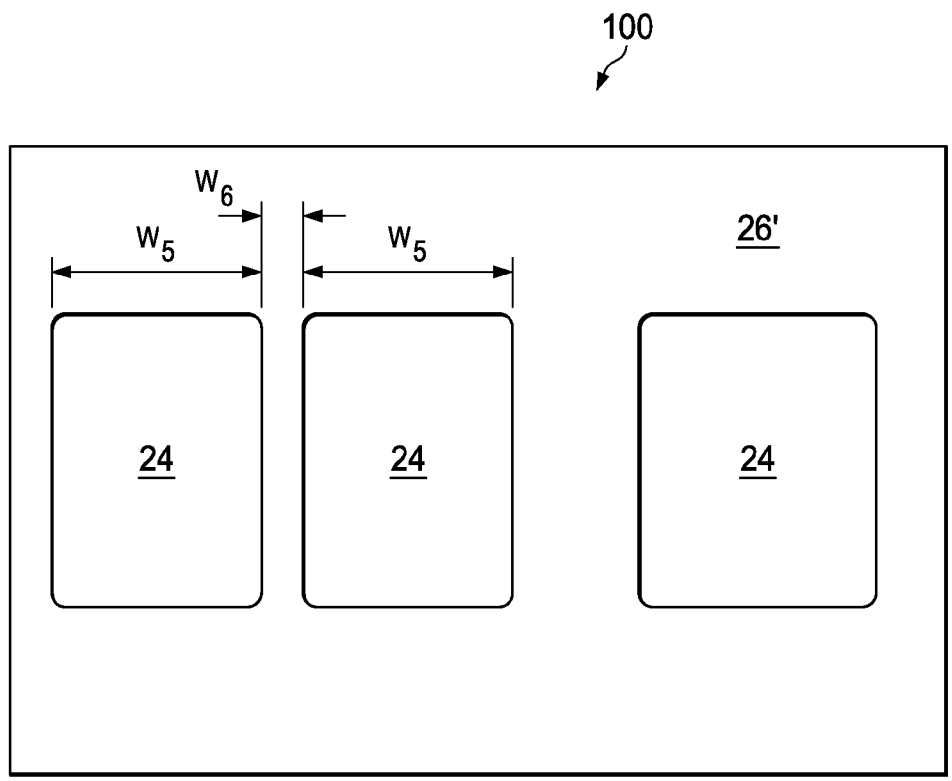
Figure 3B:
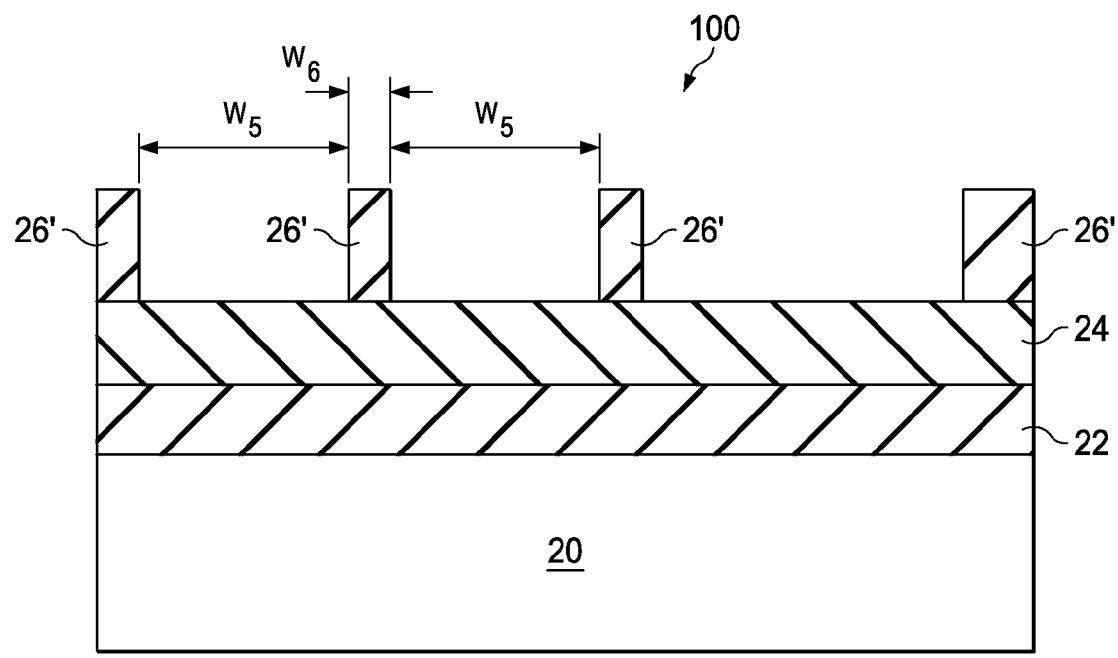
Figure 4A:
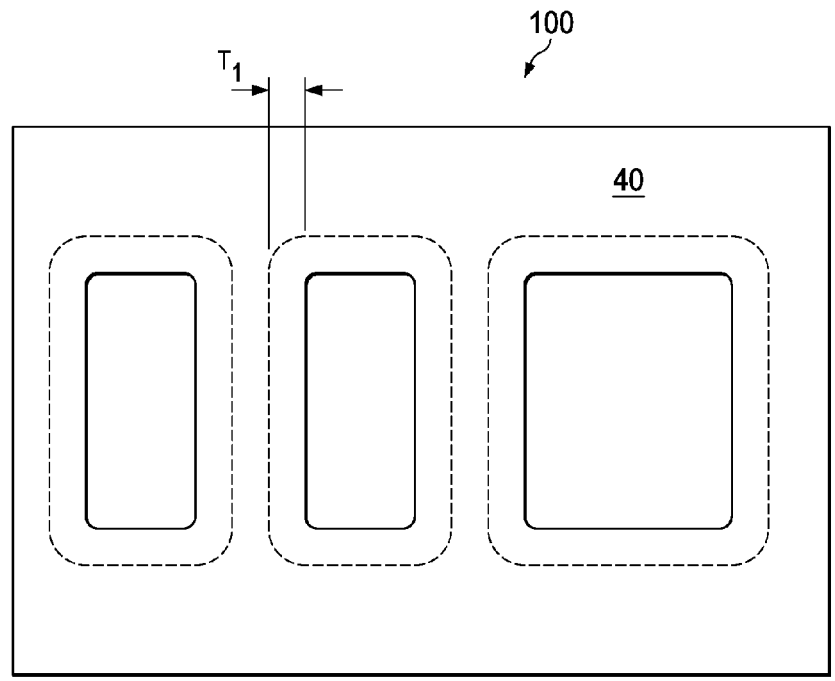
Figure 4B:
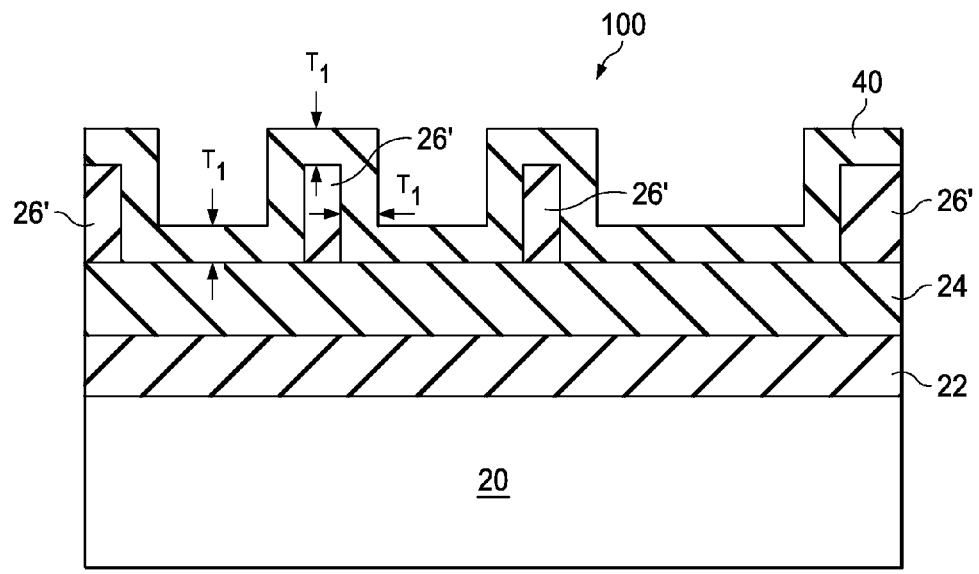

FIGS. 3A and 3B illustrate the resulting structure after the mandrel layer 26 has been patterned forming openings and mandrels 26'. After developing and patterning the top photoresist layer 32, the pattern is transferred to the middle and bottom layers 30 and 28, respectively. The pattern may be transferred, for example, by one or more selective etching processes. After the selective etching processes, the top photoresist layer 32 and the middle layer 30 may be removed by, for example, another trimming process such as an anisotropic plasma etch process. In some embodiments, portions of the bottom layer 28 are also removed during the trimming process to achieve a more stable aspect ratio for subsequent etching steps. In an embodiment, the mandrel layer 26 is etched using the bottom layer 28 as a patterning mask forming the mandrels 26'. In this embodiment, the remaining portions of the bottom layer 28 are removed by, for example, an in-situ $O_2$ or $H_2$ plasma process. In another embodiment, the trimming process is omitted, and the mandrel layer 26 is patterned using all three of three layers (32, 30, and 28) of the tri-layer photoresist 34 forming the mandrels 26'. In some embodiments, the mandrel layer 26 is patterned by a dry etch process with etch process gases including Br, $O_2$, $N_2$, $H_2$, $C_xF_y$, the like, or a combination thereof. In an embodiment, the mandrel patterning process is performed at a temperature from about 20° C. to about 80° C., at a pressure from about 20 milliTorr to about 150 milliTorr, for a duration of about 30 seconds to about 2 minutes. As illustrated in FIGS. 3A and 3B, the mandrel 26' patterned by the portion of the top photoresist layer 32 between the openings 36 of the top photoresist layer 32 (see FIGS. 2A and 2B) has the width $W_6$ and is spaced apart from adjacent mandrels 26' by the widths $W_5$.

After the mandrels 26' are formed, a spacer layer 40 is formed over the mandrels 26' and the hard mask layer 24. In an embodiment, the spacer layer 40 is conformally deposited over the mandrels 26' and the hard mask layer 24 such that the thickness $T_1$ of the spacer layer on the top surface of the hard mask layer 24 and the sidewalls of the mandrels 26' is substantially a same thickness. In some embodiments, the spacer layer 40 is a metal-containing spacer layer 40 and is made of, titanium nitride, titanium oxide, the like, or a combination thereof. In an embodiment, the spacer layer 40 is an oxide.

The material of the spacer layer 40 is selected to have a high etch selectivity to the hard mask layer 24, the mandrels 26', and the subsequently formed spacer layer 42 (see FIGS. 5A and 5B) so that subsequent etching steps may be performed on the spacer layer 40 without attacking the hard mask layer 24, the mandrels 26', and the spacer layer 42. The spacer layer 40 may be deposited through a process such as ALD, CVD, PVD, the like, or a combination thereof, although any acceptable process may be utilized to form the spacer layer 40 to a thickness from about 50 Angstroms to about 250 Angstroms. Further, the thickness of the spacer layer 40 may be selected to determine the thickness of features eventually formed in the semiconductor device layer 20.

Figure 5A:
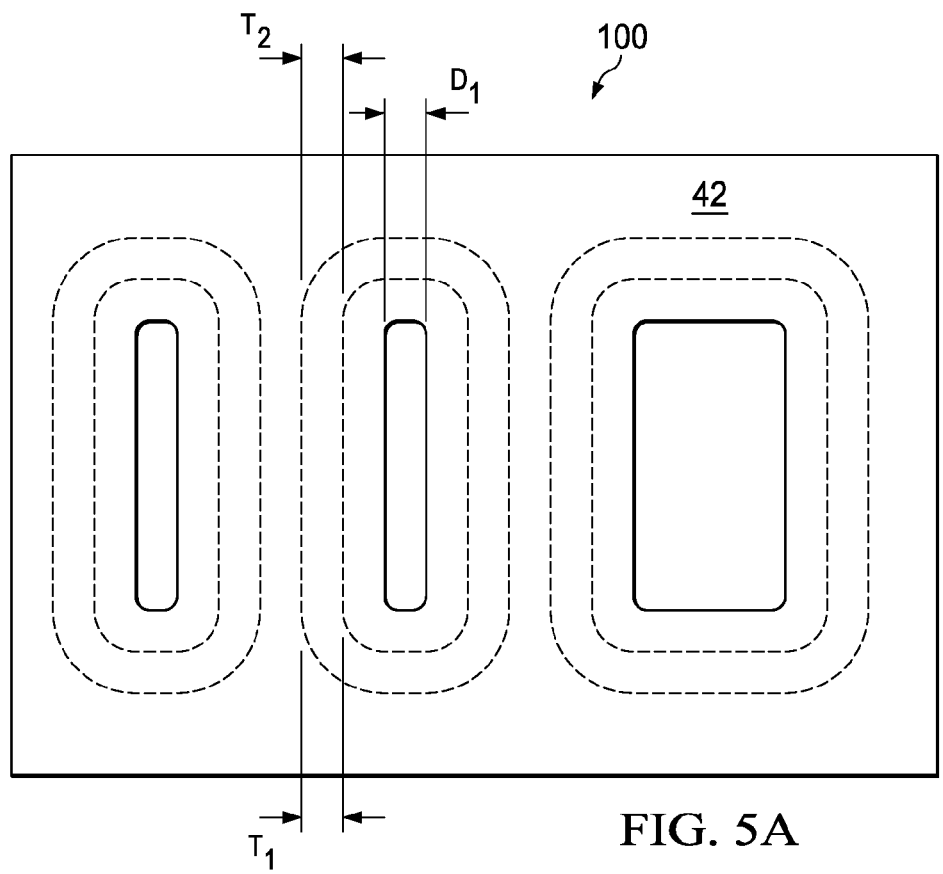
Figure 5B:
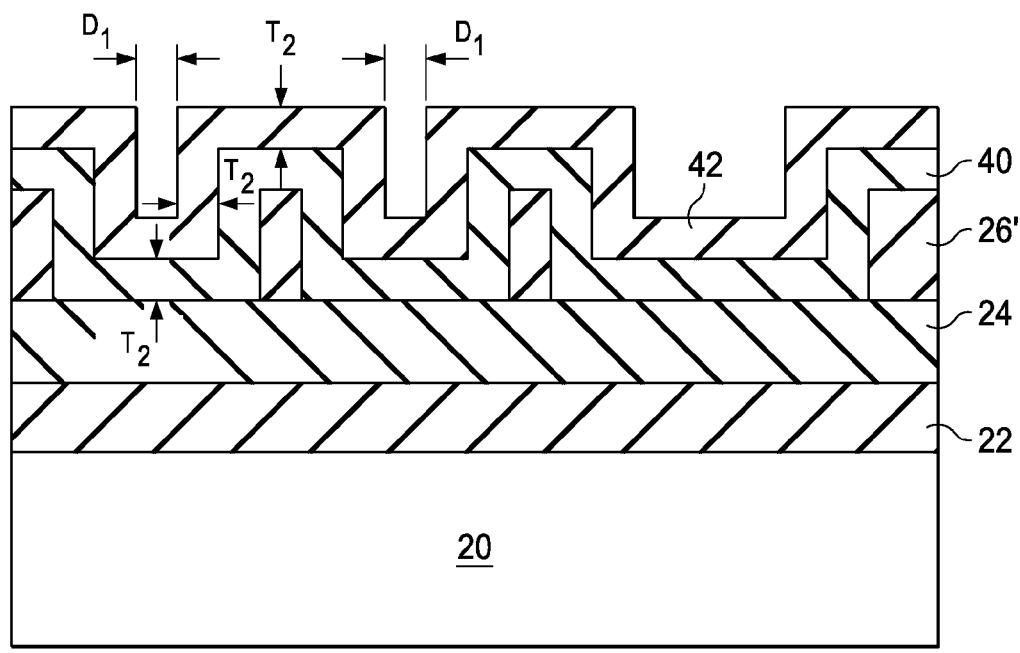

After the spacer layer 40 is formed, a spacer layer 42 is formed over spacer layer 40 as illustrated in FIGS. 5A and 5B. In an embodiment, the spacer layer 42 is conformally deposited over spacer layer 40 such that the thickness $T_2$ of the spacer layer on the top surface of the spacer layer 40 and the sidewalls of spacer layer 40 is substantially a same thickness. In an embodiment, the adjacent sidewalls of the spacer layer 42 are separated by a distance $D_1$. The distance $D_1$ may be about 1X. The distance $D_1$ may be adjusted by varying the widths of the openings between the mandrels 26' and the thicknesses $T_1$ and $T_2$ of the spacer layers 40 and 42, respectively. In some embodiments, the spacer layer 42 is a metal-containing spacer layer 42 and is made of, titanium nitride, titanium oxide, the like, or a combination thereof. In an embodiment, the spacer layer 42 is a silicon nitride, an oxide, the like, or a combination thereof. The material of the spacer layer 42 is selected to have a high etch selectivity to the spacer layer 40, the mandrels 26', and the hard mask layer 24 so that subsequent etching steps may be performed on the spacer layer 40 without attacking the spacer layer 40, the mandrels 26', and the hard mask layer 24. In some embodiments, the spacer layer 42 and the spacer layer have a different material composition so that the spacer layers may have a high etch selectivity. The spacer layer 42 may be deposited through a process such as ALD, CVD, PVD, the like, or a combination thereof, although any acceptable process may be utilized to form the spacer layer 42 to a thickness from about 50 Angstroms to about 250 Angstroms. In an embodiment, the thickness $T_1$ of the spacer layer 40 and the thickness $T_2$ of the spacer layer 42 are a substantially same thickness. Further, the thickness of the spacer layer 42 may be selected to determine the thickness of features eventually formed in the semiconductor device layer 20. In some embodiments, the thicknesses $T_1$ and $T_2$ are about 1X.

Figure 6A:
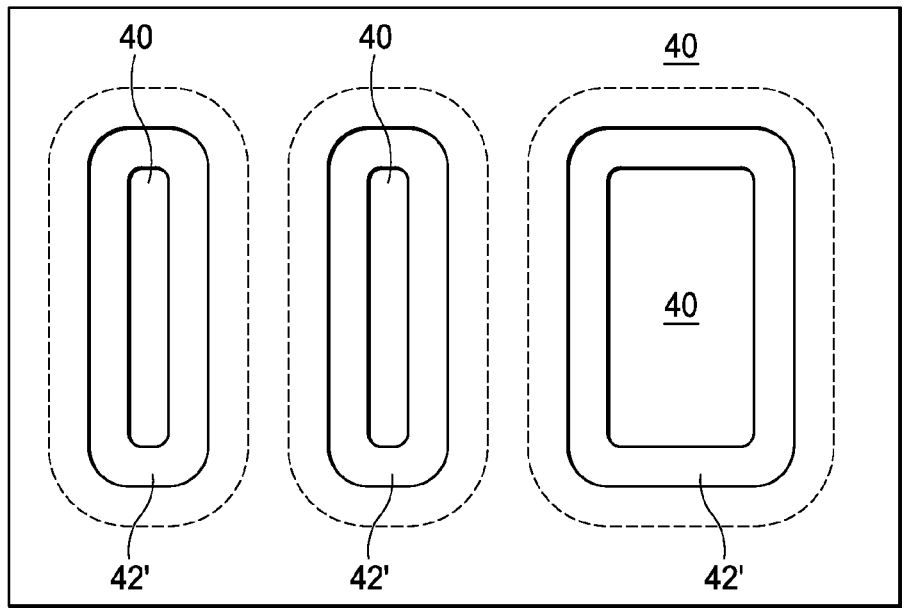
Figure 6B:
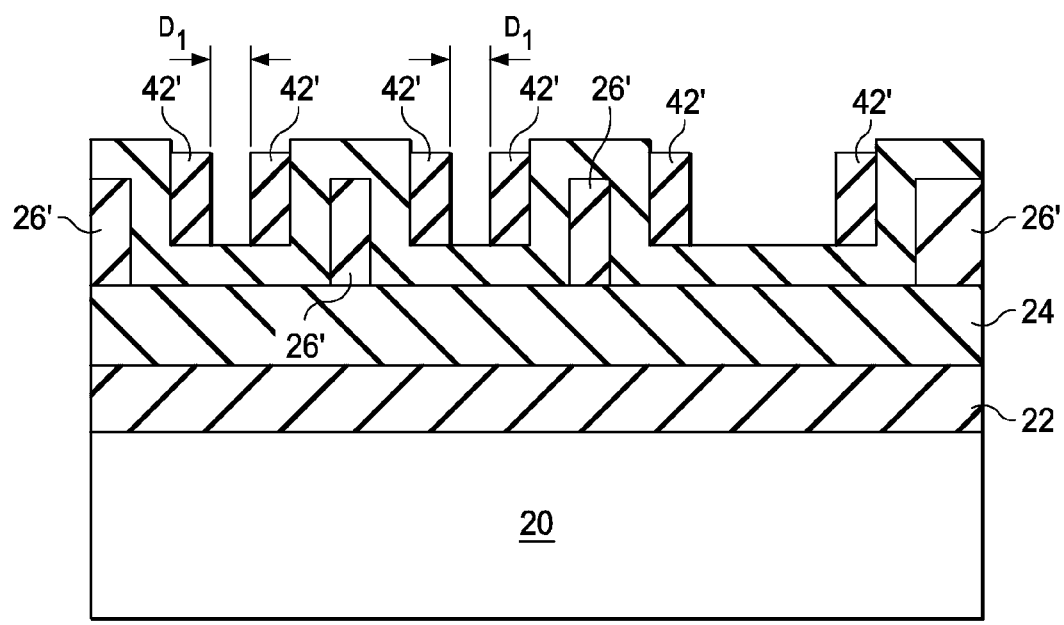

After the spacer layer 42 is formed over the spacer layer 40, the spacer layer 42 may be etched to expose top surfaces of the spacer layer 40 and form spacers 42' as illustrated in FIGS. 6A and 6B. The top portions of the spacer layer 42 may be anisotropically etched to expose the underlying top surfaces of the spacer layer 40 to form the spacers 42'. The spacers 42' are formed along the sidewalls of the spacer layer 40 in the openings of the mandrel layer 26. In an embodiment, the etchant used to etch the top portions of the spacer layer 42 is Br, $Cl_2$, $O_2$, $N_2$, $H_2$, CxFy, the like, a combination thereof, or any suitable etchant that can remove the top surfaces of the spacer layer 42.

Figure 7A:
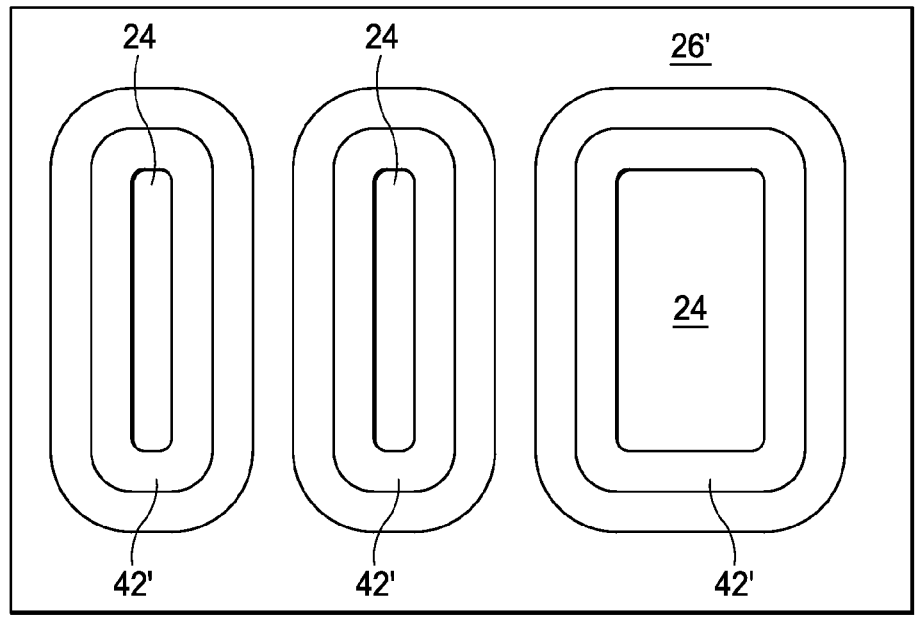
Figure 7B:
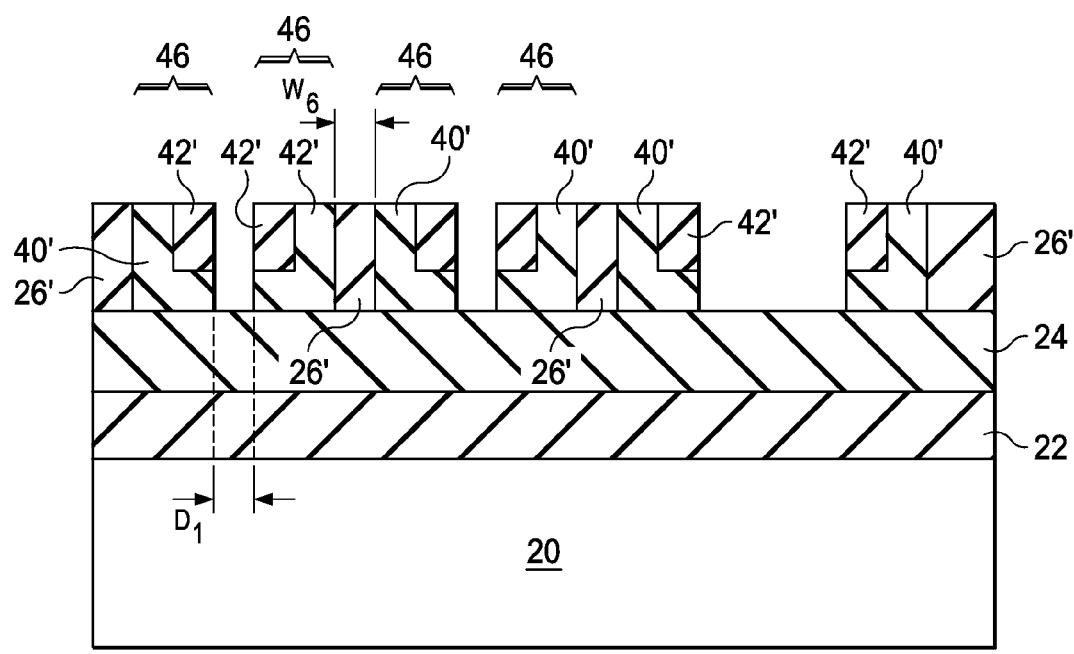

FIGS. 7A and 7B illustrate the etching of the spacer layer 40. The spacer layer 40 may be etched to expose top surfaces of the hard mask layer 24 and the mandrels 26' to form spacers 40'. In an embodiment, each of the spacers 40' adjoins at least two sides of a spacer 42'. The top portions of the spacer layer 40 may be anisotropically etched to expose the underlying top surfaces of the hard mask layer 24 and the mandrels 26'. The spacers 40' are formed along the sidewalls of the mandrels 26' in the openings of the mandrel layer 26. In an embodiment, the etchant used to etch the top portions of the spacer layer 42 is Br, $Cl_2$, $O_2$, $N_2$, $H_2$, CxFy, the like, a combination thereof, or any suitable etchant that can remove the top surfaces of the spacer layer 42. In an embodiment, a bottom surface of each of the spacers 42' adjoins a top surface of a spacer 40'. Each of the spacers 40' have a width corresponding to thickness $T_1$ and the spacers 42' have a width corresponding to thickness $T_2$. The spacers 40' and spacers 42' form a set of combined spacers 46 with each combined spacer including one spacer 40' and one spacer 42'.

Figure 8A:
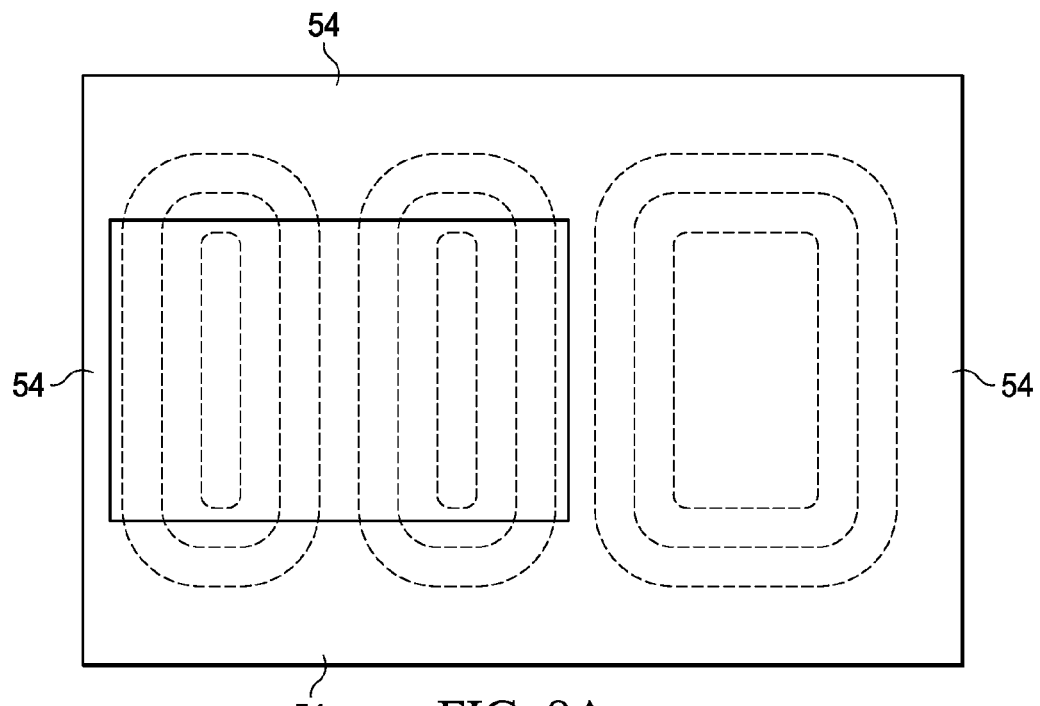
Figure 8B:
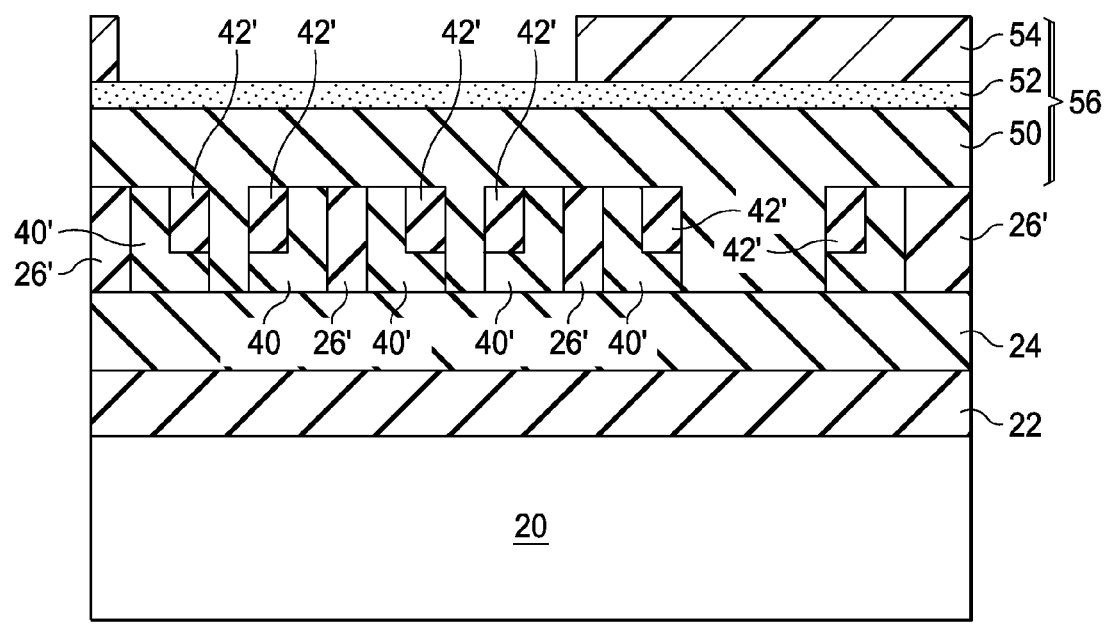

After the spacers 42' are formed, a tri-layer photoresist 56 is formed over the spacers 42', the spacers 40', and the mandrels 26' as illustrated in FIGS. 8A and 8B. The tri-layer photoresist 56 may be substantially similar to tri-layer photoresist 34 and includes a relatively thin top photoresist layer 54, a middle layer 52 (e.g., a BARC), and a bottom layer 50 (e.g., a hard mask material).

The top photoresist layer 54 may be patterned, for example, by using an immersion photolithography system including a radiation beam which may be a 248 nm beam from a KrF excimer laser or a 193 nm beam from an ArF excimer laser to expose portions of top photoresist layer 54 and develop the exposed/unexposed portions depending on whether a positive/negative photoresist is used. Thus, a pattern such as the pattern illustrated in FIGS. 8A and 8B is formed in the top photoresist layer 54 including the opening in the top photoresist layer 54 over the spacers 42', the spacers 40', and the mandrels 26' formed in the openings of the mandrel layer 26 corresponding to the openings 36 (see FIGS. 2A and 2B). This pattern includes a portion of the top photoresist layer 54 covering portions of the spacers 42', portions of the spacers 40', and portions of the mandrels 26' formed in the opening of the mandrel layer 26 corresponding to the opening 38 (see FIGS. 2A and 2B). The pattern of the top photoresist layer 54 will be used to mask the portions of the spacers 40' formed in the opening of the mandrel layer 26 corresponding to the opening 38 (see FIGS. 2A and 2B) such that the portions of the spacers 40' formed in the openings of the mandrel layer 26 corresponding to the openings 36 (see FIGS. 2A and 2B) may be removed by a subsequent etching process. The pattern shown in FIGS. 8A and 8B is for illustrative purposes only and different patterns may be formed depending on the design of semiconductor device 100.

Figure 9A:
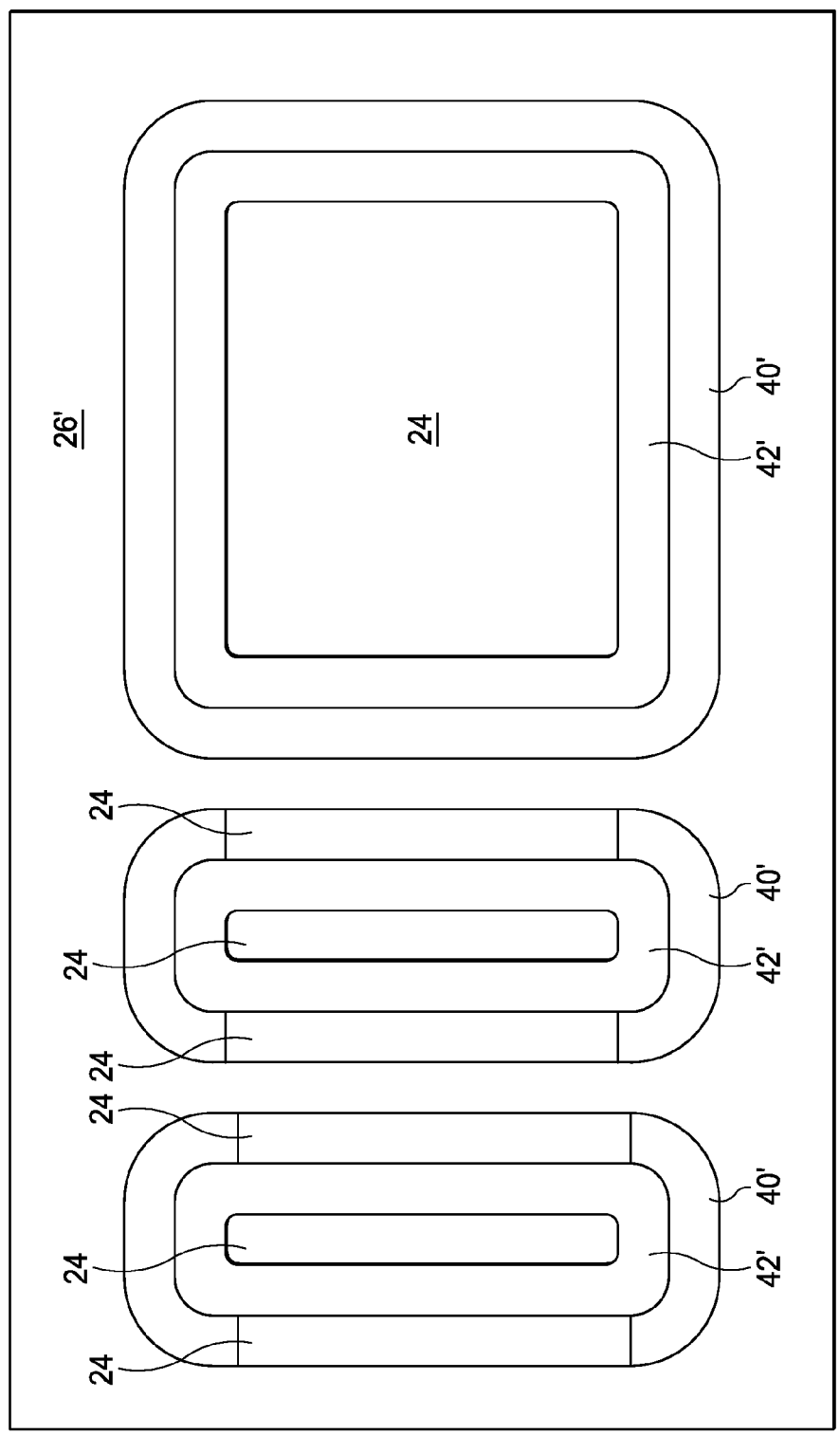
Figure 9B:
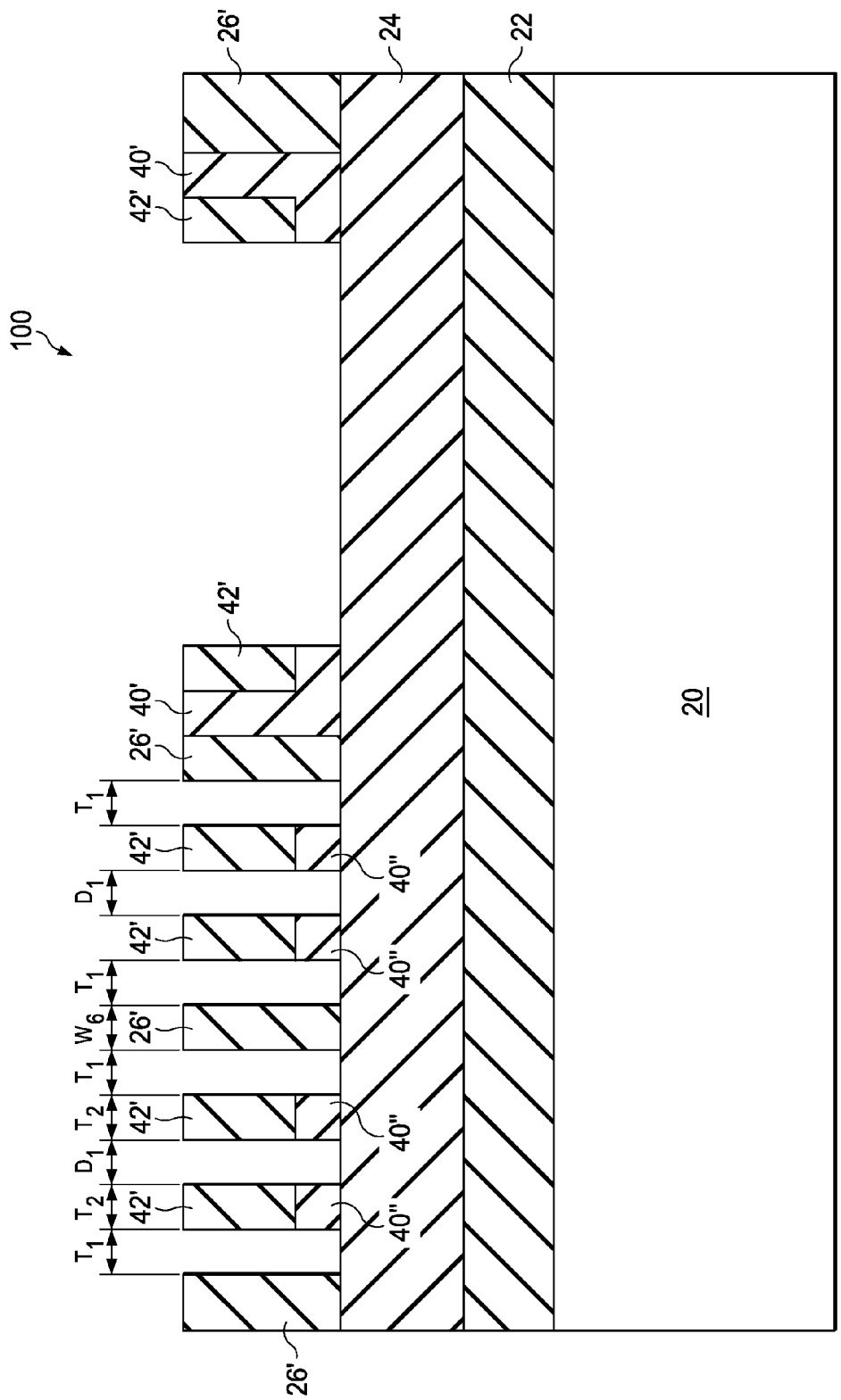

FIGS. 9A and 9B illustrate the removal of the portions of the spacers 40' exposed in the opening of the top photoresist layer 54 (see FIGS. 8A and 8B) forming the remaining portions of the spacers 40'' in the opening. The middle layer 52 and the bottom layer 50 of the tri-layer photoresist 56 are patterned by the top photoresist layer 54 such that top surfaces of the spacers 40' are exposed. In an embodiment, the exposed spacers 40' are patterned by a dry etch process with etch process gases including Br, $Cl_2$, $O_2$, $N_2$, $H_2$, CxFy, the like, a combination thereof, or any other suitable etchant that can remove the exposed portions of the spacers 40' without damaging the spacers 42' and the mandrels 26'. The portions of the spacers 40' are removed from between an adjacent mandrel 26' and spacer 42' and between adjacent spacers 42'. In some embodiments, each of the remaining portions of the spacers 40'' has a top surface that adjoins a bottom surface of a spacer 42'. In an embodiment, each of the remaining portions of the spacers 40'' adjoins only one side of a spacer 42'.

As illustrated in FIG. 9B, the pattern formed by the spacers 42', the remaining portions of the spacers 40'', and the mandrels 26' have widths determined by the thickness $T_2$ of the spacer layer 42 and the width $W_6$ of the mandrel 26'. This pattern has spacing determined by the thickness $T_1$ of the spacer layer 40 and the distance $D_1$ between adjacent sidewalls of the spacer layer 42. Thus, if each the thicknesses $T_1$ and $T_2$, the width $W_6$, and the distances $D_1$ are about 1X, the pitch of the pattern illustrated in FIG. 9B is 2X. In the exemplary embodiment where X is about 16 nm, the pitch would be 32 nm.

Figure 10A:
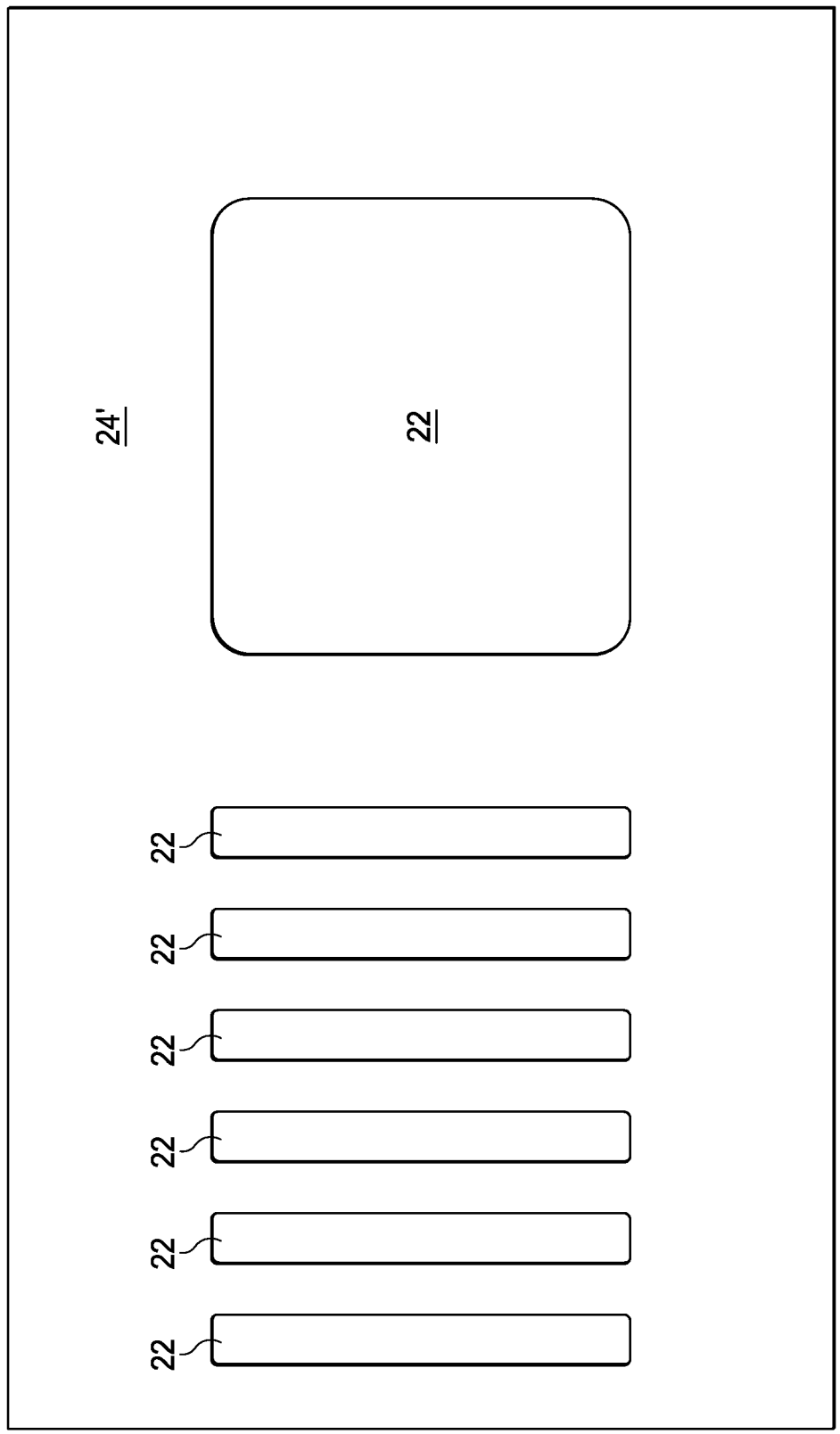
Figure 10B:
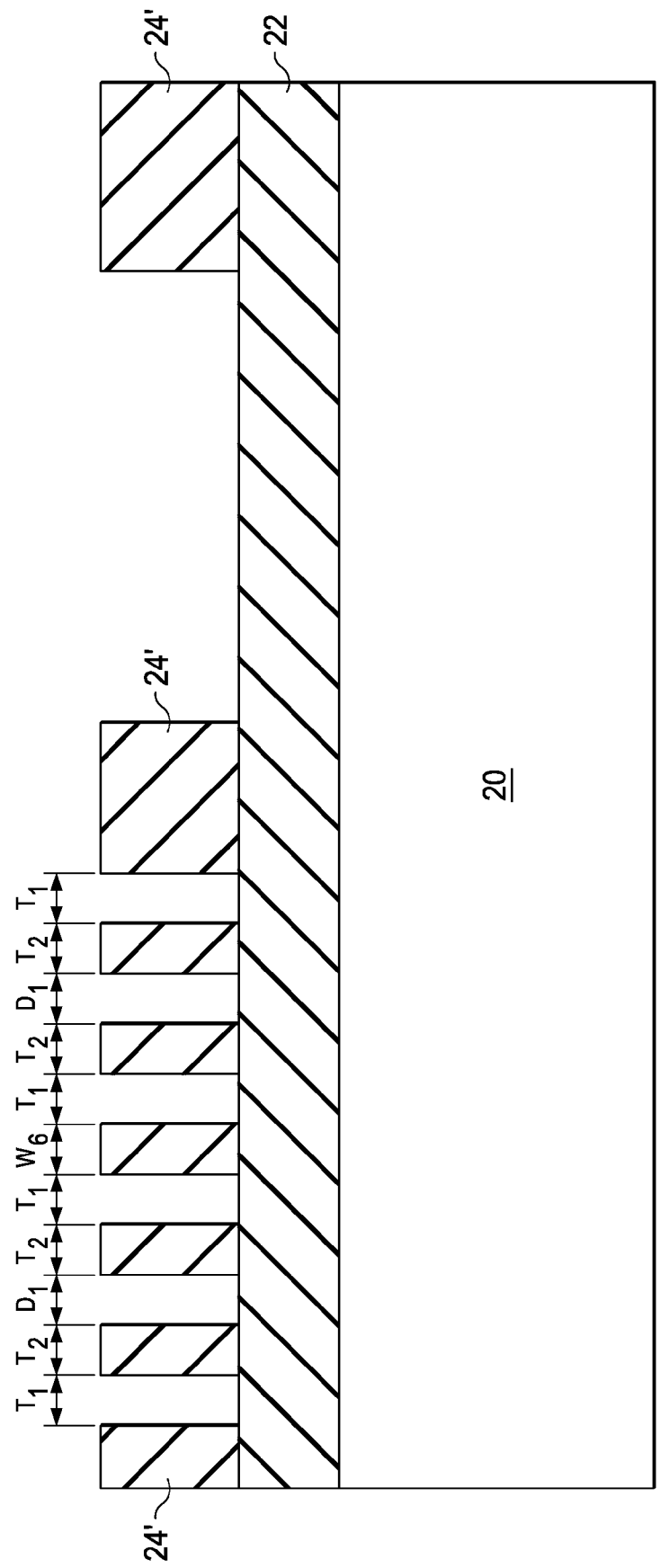

As illustrated in FIGS. 10A and 10B, the pattern in FIGS. 9A and 9B may be used to pattern the hard mask layer 24 to form a patterned hard mask layer 24'. In an embodiment, the hard mask layer 24 is patterned using an etch process including etchant gases comprising $Cl_2$, Br, $O_2$, $N_2$, $H_2$, CxFy, the like, or a combination thereof.

FIG. 11 illustrates patterning the ARC 22 and the semiconductor device layer 20 using the patterned hard mask layer 24' as a mask. The ARC 22 may be patterned using the patterned hard mask layer 24' as a mask. The ARC 22 may be patterned by an etch process including etchants such as $C_4F_8$, $N_2$, $O_2$, Ar, CxFy, the like, or a combination thereof. The patterned hard mask layer 24' may be used to transfer the illustrated pattern to the semiconductor device layer 20, for example, through an etching process to form a patterned semiconductor device layer 20'. In an embodiment, an upper portion of the he patterned semiconductor device layer 20' has a plurality of trenches 60 and a trench 62 formed therein. The patterned hard mask layer 24' and the ARC layer 22 may then be removed as shown in FIG. 11. The plurality of trenches 60 may be filled with a conductive material to form a plurality of conductive lines 64 (see FIG. 12).

Figure 12:
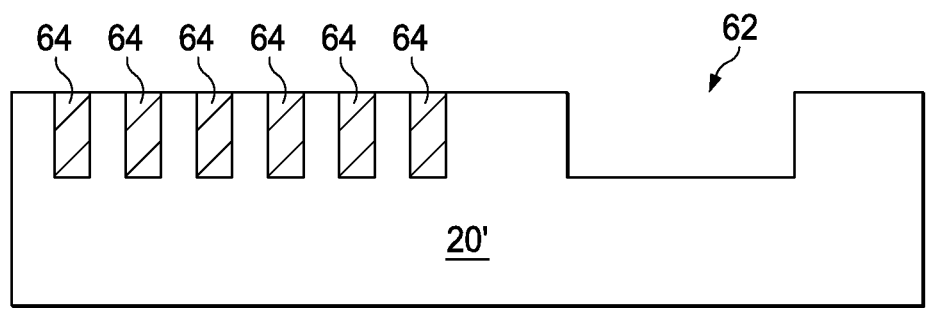

FIG. 12 illustrates forming a conductive material 64 over the patterned semiconductor device layer 20', filling the plurality of trenches 60. The conductive material 64 may include a barrier layer, a seed layer, a liner, or multiple layers or combinations thereof, for example, not shown. A fill material such as copper, a copper alloy, aluminum, an aluminum alloy, the like, or a combination thereof may be formed over the layers/liner using an electro-chemical plating (ECP) method and/or other deposition method. A chemical-mechanical polish (CMP) process and/or etch process may be used to remove excess conductive material 64 from over the top surface of the patterned semiconductor device layer 20', as shown in FIG. 12, forming a plurality of conductive lines 64 in the patterned semiconductor device layer 20'. The conductive lines 64 have substantially the same pitch and spacing as the patterned hard mask layer 24' shown in FIGS. 10A and 10B. In some embodiments, the trench 62 is also filled with a conductive material to form a conductive feature (not shown).

The materials for the various layers may be selected to ensure sufficient etch selectivity between the layers. In an exemplary embodiment, the hard mask layer 24 is titanium nitride, the mandrel layer 26 is TEOS, the spacer layer 40 is an oxide, and the spacer layer 42 is silicon nitride. In another exemplary embodiment, the hard mask layer 24 is TEOS, the mandrel layer 26 is silicon, the spacer layer 40 is titanium oxide, and the spacer layer 42 is silicon nitride. In another exemplary embodiment, the hard mask layer 24 is TEOS, the mandrel layer 26 is silicon nitride, the spacer layer 40 is titanium nitride, and the spacer layer 42 is silicon nitride. In another exemplary embodiment, the hard mask layer 24 is TEOS, the mandrel layer 26 is silicon nitride, the spacer layer 40 is titanium oxide, and the spacer layer 42 is silicon nitride. In another exemplary embodiment, the hard mask layer 24 is silicon nitride, the mandrel layer 26 is an oxide, the spacer layer 40 is titanium oxide, and the spacer layer 42 is an oxide. These embodiments are only examples of possible combinations of the materials that may be used and the present disclosure is not intended to be limited to these particular embodiments.

By forming two spacer layers 40 and 42 with substantially the same thicknesses, quadruple patterning is achieved to reduce the pitch, which allows the use of more proven lithography technology. For example, the current process can use 96 nm pitch lithography and two 16 nm thick spacer layers to achieve a 32 nm pitch interconnect. Thus, the current process can utilize 193 nm immersion lithography to achieve 32 nm pitch while also having a lower cost and higher throughput than the newer lithography methods such as extreme ultraviolet (EUV) lithography or the like.

An embodiment is a method of forming a semiconductor device, the method including forming a first hard mask layer over a semiconductor device layer, forming a set of mandrels over the first hard mask layer, and forming a first spacer layer over the set of mandrels and the first hard mask layer. The method further includes forming a second spacer layer over the first spacer layer, patterning the first spacer layer and the second spacer layer to form a mask pattern, and patterning the first hard mask layer using the mask pattern as a mask.

Another embodiment is a method of patterning a semiconductor device, the method including forming a first hard mask layer over a semiconductor device layer, forming at least one mandrel over the first hard mask layer, conformally depositing a first spacer layer to have a uniform thickness over the at least one mandrel and the first hard mask layer, and conformally depositing a second spacer layer to have a uniform thickness over the first spacer layer. The method further includes patterning the first spacer layer and the second spacer layer to form a first set of spacers on sidewalls of the at least one mandrel, each of the first set of spacers comprising a portion of the first spacer layer and a portion of the second spacer layer, each of the first set of spacers having a first width, patterning the first set of spacers to form a second set of spacers over the first hard mask layer, each of the second set of spacers having a second width, the second width being less than the first width, and patterning the first hard mask layer and the semiconductor device layer using the second set of spacers as a mask.

A further embodiment is a method of patterning a semiconductor device, the method including forming a second hard mask layer over a first hard mask layer and a semiconductor device layer, patterning the second hard mask layer to form a plurality of second hard mask portions, conformally forming a first spacer layer over the plurality of second hard mask portions and the first hard mask layer, and conformally forming a second spacer layer over the first spacer layer. The method further includes removing top surfaces of the second spacer layer to expose top surfaces of the first spacer layer, removing the exposed top surfaces of the first spacer layer to expose top surfaces of the first hard mask layer and to form a mask pattern, and patterning the first hard mask layer and the semiconductor device layer using the mask pattern as a mask.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first hard mask layer over a semiconductor device layer;
   forming a set of mandrels over the first hard mask layer;
   forming a first spacer layer over the set of mandrels and the first hard mask layer;
   forming a second spacer layer over the first spacer layer;
   patterning the first spacer layer and the second spacer layer to form a mask pattern, the patterning further comprising:
      etching the second spacer layer to expose the first spacer layer; and
      etching the exposed first spacer layer to expose surfaces of the first hard mask layer between the set of mandrels and remaining portions of the second spacer layer; and
   patterning the first hard mask layer using the mask pattern as a mask.

2. The method of claim 1, wherein the forming the first spacer layer over the set of mandrels and the first hard mask layer comprises conformally depositing the first spacer layer to have a uniform first thickness over the set of mandrels and the first hard mask layer, and wherein the forming the second spacer layer over the first spacer layer comprises conformally depositing the second spacer layer to have a uniform second thickness over the first spacer layer.

3. The method of claim 2, wherein the first thickness and the second thickness are substantially a same thickness.

4. The method of claim 1, wherein the etching the second spacer layer forms a first set of spacers having a first width on sidewalls of the set of mandrels, and wherein the etching the first spacer layer forms a second set of spacers of a second width, the second width being less than the first width.

5. The method of claim 4, wherein each of the second set of spacers adjoins two sides of a corresponding first spacer.

6. The method of claim 4, wherein each of the first set of spacers has a bottom surface adjoining a top surface of a corresponding second spacer.

7. The method of claim 1, wherein the forming the set of mandrels over the first hard mask layer comprises:
   forming a mandrel layer over the first hard mask layer; and
   patterning the mandrel layer to form the set of mandrels.

8. The method of claim 7, wherein the patterning the mandrel layer comprises:
   forming a photoresist over the mandrel layer;
   patterning the photoresist to have at least one portion of a first width;
   trimming the at least one portion of the photoresist to have a second width, the second width being smaller than the first width; and
   patterning the mandrel layer using the patterned and trimmed photoresist as a mask, at least one mandrel of the set of mandrels having the second width.

9. The method of claim 8, wherein the second width is about one-third of the first width.

10. The method of claim 8, wherein the photoresist is a tri-layer photoresist comprising a top photoresist layer, a middle layer, and a bottom layer, wherein the middle layer comprises an anti-reflective material, and wherein the bottom layer comprises a hard mask material.

11. The method of claim 1, wherein at least one of the first spacer layer and the second spacer layer is a metal-containing spacer layer.

12. A method of patterning a semiconductor device, the method comprising:
   forming a first hard mask layer over a semiconductor device layer;
   forming at least one mandrel over the first hard mask layer;
   conformally depositing a first spacer layer to have a uniform thickness over the at least one mandrel and the first hard mask layer;
   conformally depositing a second spacer layer to have a uniform thickness over the first spacer layer;
   patterning the first spacer layer and the second spacer layer to form a first set of spacers on sidewalls of the at least one mandrel, each of the first set of spacers comprising a portion of the first spacer layer and a portion of the second spacer layer, each of the first set of spacers having a first width;
   patterning the first set of spacers to form a second set of spacers over the first hard mask layer, each of the second set of spacers having a second width, the second width being less than the first width; and
   patterning the first hard mask layer and the semiconductor device layer using the second set of spacers as a mask.

13. The method of claim 12, wherein the second width is about one-half of the first width.

14. The method of claim 12, wherein each of the second set of spacers are separated from adjacent spacers of the second set of spacers by a first spacing, the first spacing being substantially equal to the second width.

15. The method of claim 12, wherein at least a portion of each of the second set of spacers comprises titanium.

16. The method of claim 12, wherein the portion of the second spacer layer is over the portion of the first spacer layer in each of the first set of spacers.

17. The method of claim 12, wherein the semiconductor device layer is a low-k dielectric layer.

18. A method of patterning a semiconductor device, the method comprising:
   forming a second hard mask layer over a first hard mask layer and a semiconductor device layer;
   patterning the second hard mask layer to form a plurality of second hard mask portions;
   conformally forming a first spacer layer over the plurality of second hard mask portions and the first hard mask layer;
   conformally forming a second spacer layer over the first spacer layer;
   removing top surfaces of the second spacer layer to expose top surfaces of the first spacer layer;
   removing the exposed top surfaces of the first spacer layer to expose top surfaces of the first hard mask layer and to form a mask pattern, the removing of the exposed top surfaces of the first spacer layer comprising:
      etching the exposed top surfaces of the first spacer layer to expose top surfaces of the second hard mask portions; and
      etching remaining portions of first spacer layer to expose top surfaces of the first hard mask layer between the second hard mask portions and remaining portions of the second spacer layer; and
   patterning the first hard mask layer and the semiconductor device layer using the mask pattern as a mask.

19. The method of claim 18 further comprising forming a conductive material in openings of the patterned semiconductor device layer, the conductive material forming a set of conductive lines in the patterned semiconductor device layer.

20. the method of claim 18, wherein the first spacer layer and the second spacer layer are formed to have substantially a same thickness.

* * * * *